US007132668B2

(12) United States Patent
Vispute et al.

(10) Patent No.: US 7,132,668 B2
(45) Date of Patent: Nov. 7, 2006

(54) MGZNO BASED UV DETECTORS

(75) Inventors: Ratnakar Vispute, Columbia, MD (US); Thirumalai Venkatesan, Washington, DC (US); Wei Yang, Greenbelt, MD (US); Supab Choopun, Chiang Mai (TH)

(73) Assignee: University of Maryland, College Park, MD (US)

( * ) Notice: Subject to any disclaimer, the term of this patent is extended or adjusted under 35 U.S.C. 154(b) by 86 days.

(21) Appl. No.: 10/311,997

(22) PCT Filed: Jun. 26, 2001

(86) PCT No.: PCT/US01/41124

§ 371 (c)(1), (2), (4) Date: Feb. 20, 2003

(87) PCT Pub. No.: WO02/01650

PCT Pub. Date: Jan. 3, 2002

(65) Prior Publication Data
US 2003/0160176 A1    Aug. 28, 2003

Related U.S. Application Data

(60) Provisional application No. 60/214,196, filed on Jun. 26, 2000.

(51) Int. Cl.
*G01J 5/00*    (2006.01)
(52) U.S. Cl. .................................. 250/372; 250/370.01
(58) Field of Classification Search ................ 250/372, 250/370.01, 370.06, 370.12; 257/94, 96, 257/97, 98; 438/22, 34, 20
See application file for complete search history.

(56) References Cited

U.S. PATENT DOCUMENTS

| 4,241,258 | A | | 12/1980 | Cholin |
| 4,731,881 | A | | 3/1988 | Geller |
| 5,331,168 | A | | 7/1994 | Beaubien et al. |
| 5,446,286 | A | | 8/1995 | Bhargava |
| 5,574,286 | A | | 11/1996 | Huston et al. |
| 5,626,670 | A | * | 5/1997 | Varshney et al. ............... 117/7 |
| 6,057,561 | A | * | 5/2000 | Kawasaki et al. ............. 257/94 |
| 6,104,074 | A | | 8/2000 | Chen |
| 6,137,123 | A | | 10/2000 | Yang et al. |
| 6,423,983 | B1 | * | 7/2002 | Narayan et al. ............... 257/96 |
| 6,518,077 | B1 | * | 2/2003 | Narayan et al. ............... 438/22 |
| 6,559,736 | B1 | * | 5/2003 | Lu et al. ..................... 333/152 |

OTHER PUBLICATIONS

D.C. Look et al., "Production and Annealing of Electron Irradiation Damage in ZnO" in Appl. Phys. Lett. 75, No. 6 (Aug. 9, 1999) pp. 811-813.

(Continued)

*Primary Examiner*—Otilia Gabor
(74) *Attorney, Agent, or Firm*—Dykema Gossett PLLC

(57) ABSTRACT

Photoconductive devices (1,2) comprising $Mg_xZn_{1-x}O$, that is preferably epitaxially deposited on a substrate (21), optionally also including a buffer layer (22), wherein x has a value such that the layer is sensitive to UV light. The a MgZnO device (2) having predetermined electrical and optical properties and first and second electrodes (3) deposited on a surface of the device, the second electrode being spaced from the first electrode. A voltage source (4) is connected across the first and second electrodes to create an electric field within the device. In operation, when the surface of the device upon which the electrodes are deposited is subjected to a photon emission, electron-hole pairs are created within the device and flow within the device because of the electric field.

14 Claims, 6 Drawing Sheets

OTHER PUBLICATIONS

A. Ohtomo et al., "Room Temperature Ultraviolet Laser Emission . . . Laser MBE" in Mat. Sci. Eng. B54 (1998) pp. 24-28.

H. Fabricius et al., "Ultraviolet Detectors in Thin Spattered ZnO Films" in Appl. Optics, vol. 25, No. 16 (Aug. 15, 1986) pp. 2764-2767.

Y. Liu et al., "Ultraviolet Detector Based on Epitaxial 2nd Films Grown by MOCUD" in J. Elec. Mat., vol. 29, No. 1 (2000) pp. 69-73.

A. Ohtomo et al., "Mg xZn1-xO as a II-VI Widegap Semiconductor Alloy" in Appl. Phys. Lett. vol. 72, No. 19 (May 11, 1998) pp. 2466-2468.

C. W. Teng et al., "Refractive Indices and Absorption Coefficients of MgxZN1-xO Alloys" in Appl. Phys. Lett., vol. 76, No. 8 (Feb. 21, 2000) pp. 979-981.

P. Schreiber et al., "Solar Blind U.V. Region and UV Detector Development Objectives" in Proc. SPIE, vol. 3629 (1999) pp. 230-248.

A.K. Sharma et al., "Synthesis of Cubic ZnxMg1-XO . . . Laser Ablation", Abstracts of MRS, Spring 2000 Meeting, J3, 19 (2000) pp. 179-180.

* cited by examiner

MGZNO BASED UV DETECTORS

BACKGROUND OF THE INVENTION

1. Field of the Invention

The present invention relates to the optoelectronic applications of certain MgZnO materials and methods for their manufacture. More particularly, the invention relates to the use of the MgZnO materials in ultraviolet detection devices.

2. Description of the Prior Art

Photodetectors are broadly defined as devices which respond to incident electromagnetic radiation by converting the radiation into electrical energy, thereby enabling measurement of the intensity of the incident radiation. A photodetector typically includes some sort of photoconductive device and external measurement circuitry. Photodetectors have many practical applications. For instance, photodetectors find use in scientific research (such as in scintillation detectors), in manufacturing (such as in devices to detect and prevent spoilage of products by light contamination), and in safety applications (such as in preventing overexposure of workers to certain radiation).

In many applications it is desirable to detect a particular type of light, i.e., a certain range of wavelengths. In such an application, light having a wavelength falling outside the range of wavelengths, which is desired to be detected constitutes "noise" to the photodetector. Noise can cause an erroneous response from the photodetector. Prior art UV photodetectors have the drawback that they typically respond to visible light.

$Al_xGa_{1-x}N$ is a compound semiconductor that is ideally suited for devices in the visible and the ultraviolet parts of the spectrum. GaN—AlGaN based solid state ultraviolet (UV) photo detectors, sensitive to 200 nanometer (nm) to 365 nm UV radiation, have been actively sought for applications including solar-blind UV detection and flame sensing. Due to the direct band gap and availability of $Al_xGa_{1-x}N$ in the entire alloy composition range (0<x<1), GaN—AlGaN based UV detectors have the advantages of high quantum efficiency, tunability of cut-off wavelengths, and the capability of being fabricated as heterostructures. In recent years, GaN—AlGaN photo conductors and photo diodes of both Schottky and PIN junctions with good performance have been reported. Aluminum gallium nitride has a direct bandgap which is tunable from 3.4 electron volts (or 365 nanometers) at x=0 to 6.2 electron volts (or 200 nanometers) at x=1. This makes the material ideally suited for intrinsic ultraviolet sensors with high responsivities for wavelengths shorter than 365 nanometers and essentially no photosensitivity for longer wavelengths. Such sensors can there for detect ultraviolet emissions from flames in the presence of hot backgrounds (such as infrared emission from the hot bricks in a furnace).

Gallium nitride is a wide, direct bandgap semiconductor which has a broad range of potential applications for optoelectronic and high power/temperature electronic devices. A number of devices have been demonstrated, including high power, short wavelength (blue, violet) light emitting diodes or LED's, ultraviolet photoconductive detectors, ultraviolet Schottky Barrier Detectors, metal-semiconductor field effect transistors or MESFETS, high electron mobility transistors or HEMTS and heterojunction bipolar transistors or HBTs. In the past, several groups of investigators have reported on gallium nitride/aluminum gallium nitride based ultraviolet detectors, including photoconductive, Schottky Barrier, and p-n-junction ultraviolet detectors based on gallium nitride single layers or p-n-junctions. These photo-conductor devices were all of lateral geometry and suffer from several problems. For example, for photoconductors with gains of 1000, the reported bandwidth has only been around 1 kHz, which makes them too slow for many applications. This response speed problem becomes more severe with the addition of aluminum in the active layer.

The lateral Schottky Barrier devices prepared on p-doped gallium nitride were also slow because of the large series resistance of the p-type layer resulting from the lower carrier mobility and in concentration achievable. Further, for the Schottky devices, back illumination through the transparent sapphire substrate side was required. This resulted in poor quantum efficiencies because of light absorption at the gallium nitride-sapphire interface region where a very high dislocation density exists.

The detection of ultraviolet (UV) light during daylight conditions is an important problem for both commercial and military applications. It is difficult to design a very sensitive detector that can be used in broad daylight to detect very low levels of UV radiation. The spectral distribution of radiation from the sun is similar to that of a 6,000 degree blackbody radiator. The solar spectral distribution drops off very sharply below 290 nm due to atmospheric absorption by ozone. As a result, the earth's surface is essentially dark below 290 nm. A solar-blind detector can be defined as a device or apparatus that only responds to wavelengths below about 285 nm. Applications for solar-blind detectors include monitoring lightning events during thunderstorms, detecting ultraviolet laser sources such as excimer lasers or frequency quadrupled Nd:YAG lasers used as LIDAR sources, and ultraviolet telescope detectors for space platforms.

Many prior art approaches have been proposed to achieve solar blind detector performance. One approach, described in U.S. Pat. No. 4,731,881, uses a series of chemical and color glass filters to accomplish UV transmission below 285 nm and a sharp cut off, blocking wavelengths longer than 285 nm. The chemical filters consist of an expensive, single crystal nickel sulfate hexahydrate crystal that has very poor thermal and moisture stability, and an organic dye, Cation X, contained in a polyvinylalcohol film to provide UV band-pass characteristics. This approach uses a relatively expensive UV sensitive photomultiplier tube for detection.

Another approach (described in U.S. Pat. No. 4,731,881) uses a ruby crystal with interference filters coated on the two faces. The input face has a bandpass interference filter that transmits a narrow UV band at approximately 254 nm and rejects all other wavelengths. The output face of the ruby crystal is coated with an interference filter that transmits the ruby fluorescence wavelengths and blocks all other wavelengths. The performance of this device is limited by the band pass and broad band blocking capability of interference filters. A dielectric coating is limited to a rejection of about $10^5$ outside of the bandpass region. An out-of-pass-band rejection of approximately $10^8$ is necessary for true solar blind detection.

Other approaches (described in U.S. Pat. Nos. 4,241,258 and 5,331,168) use UV sensitive phosphor powders as downconverters. Phosphor powders are highly scattering and can result in reduced light collection efficiency.

Visible-blind UV detectors also have great potential in applications such as UV radiometry, flame sensing and missile guidance systems. Currently, photocathodes are the only devices capable of addressing these applications. Unfortunately, these are bulky, difficult to integrate with control electronics and in general, require high operating voltages. Typical prior art devices for achieving visible-blind UV-detection suffer from either excessively low transmission in the UV signal wavelength region or inadequate rejection of visible light.

Other UV detectors are described in U.S. Pat. Nos. 6,104,074; 5,446,286; 5,574,286 and 6,137,123.

SUMMARY OF THE INVENTION

It is an object of the present invention to overcome the above described and other drawbacks of the prior art.

It is one object of the present invention to provide an ultraviolet (UV) light photodetector which is "blind" to visible light.

It is, therefore, another object of the invention to provide an improved "solar blind" radiation detector.

Another object of the invention is to provide a solar-blind radiation detector apparatus that detects ultraviolet light at wavelengths below 290 nm in the presence of solar illumination.

It is another object of the present invention to provide a UV photodetector fabricated using MgZnO.

According to an embodiment of the invention a UV detector is provided comprising a thin film of a material comprising $Mg_xZn_{1-x}O$, wherein x has a value such that the thin film is sensitive to UV light in the wavelength range of from about 150 nm to about 400 nm.

Another embodiment of the present invention comprises a photoconductive device comprising MgZnO, that is preferably epitaxially deposited on a substrate. The deposited MgZnO may include a buffer layer deposited on the substrate and a MgZnO film deposited on the buffer layer. The electrical and optical properties of the device are controlled by varying parameters of the deposition process.

A photodetector according to one embodiment of the present invention comprises a MgZnO device having predetermined electrical and optical properties and first and second electrodes deposited on a surface of the device, the second electrode being spaced from the first electrode. A voltage source may optionally be connected across the first and second electrodes to create an electric field within the device. In operation, when the surface of the device upon which the electrodes are deposited is subjected to UV radiation, electron-hole pairs are created within the device and flow within the device.

In another embodiment, the present invention comprises a method of making a photodetector having predetermined electrical and optical properties. The method comprises fabricating a MgZnO device having predetermined electrical and optical properties of the device, depositing a first electrode on a surface of the device, and depositing a second electrode on the surface of the device, the second electrode being spaced from the first electrode. In a further step a voltage source is connected across the first and second electrodes.

DETAILED DESCRIPTION OF THE INVENTION

Figure 1:
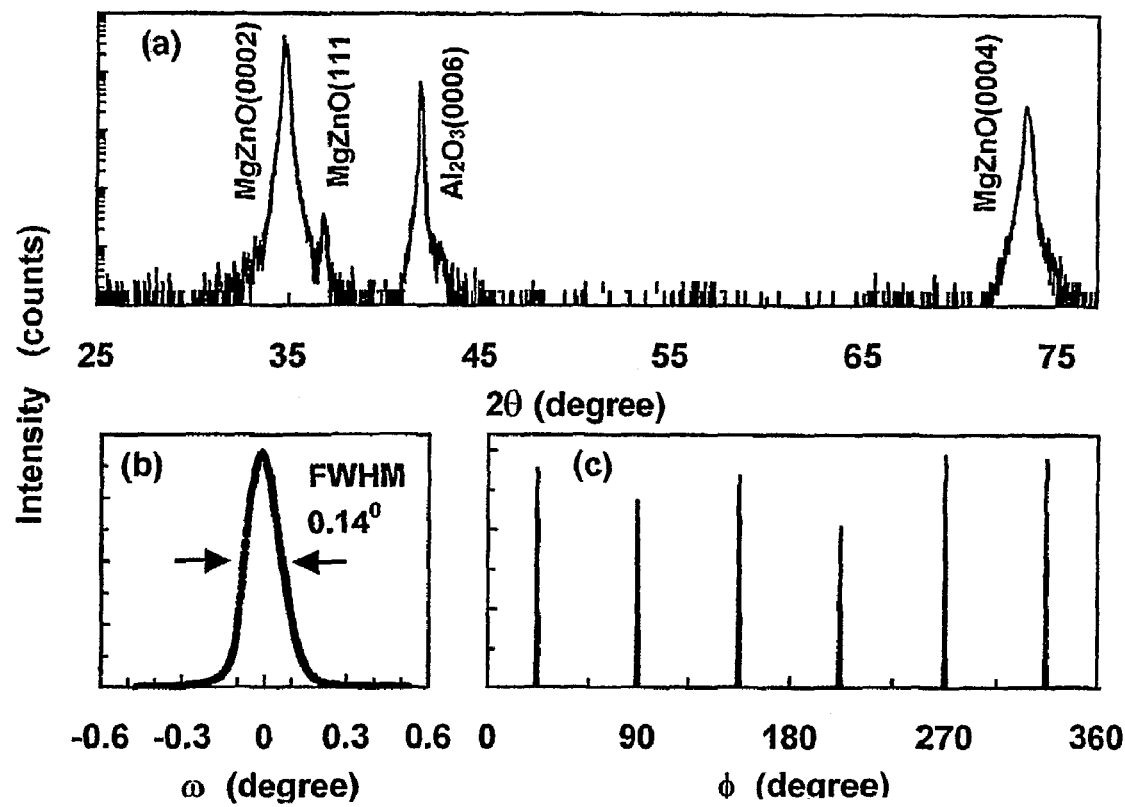
FIG. 1 depicts a XRD scan of MgZnO film according to the invention grown on an $Al_2O_3(0001)$ substrate.

ZnO is a wide band gap ($E_g$=3.3 eV) semiconductor that can be used for ultraviolet (UV) photon detection. Its high radiation hardness enables it to be used in harsh environments. [D. C. Look, D. C. Reynolds, J. W. Hemsky, R. L. Jones, and J. R. Sizelove, Appl. Phys. Lett.75, 811 (1999)]. The availability of lattice-matched single-crystal ZnO substrates and the relatively low deposition temperatures (100–750° C.) for manufacturing devices composed of ZnO ease the device processing. Owing to its large exciton binding energy (60 meV), ZnO has attracted increasing attention in recent years for potential low-threshold blue/UV lasers that can be integrated with photodetectors. [A Ohtomo, M Kawasaki, Y Sakurai, Y Yoshida, H Komuma, P Yu, Z K Tang, G K Wong, and Y Segawa, Mat. Sci. Eng. B54, 24 (1998)]. However, the lack of reliable p-type ZnO hinders any p-n junction based optoelectronic devices. Only metal-semiconductor-metal (MSM) structured UV detectors with either Schottky or ohmic contacts have been reported. [H. Fabricius, T. Skettrup, and P. Bisgaard, Appl. Optics. 25, 2764 (1986); Y. Liu, C. R. Gorla, S. Liang, N. Emanetoglu, Y. Lu, H. Shen, and M. Wraback, J. Elec. Mat. 29, 69 (2000)]. The cutoff wavelength of these ZnO TV detectors is around 377 nm. $Mg_xZn_{1-x}O$ which is manufactured by alloying MgO with ZnO, exhibits the same material advantages as pure ZnO. By varying the Mg composition, the band gap Of $Mg_xZn_{1-x}O$ can be tuned from 3.3 eV to 7.8 eV for wurtzite and cubic-structured $Mg_xZn_{1-x}O$, extending the cutoff wavelength from UV-A (320–400 nm) to UV-B (280–320 nm) and UV-C (200–280 nm) regions. [A. Ohtomo, M. Kawasaki, 1. Koida, K. Masubuchi, H. Koinuma, Y. Sakurai, Y. Yoshida, 1. Yasuda, and Y. Segawa, Appl. Phys. Left. 72, 2466 (1998); C. W. Teng, J. F. Muth, U. Ozgtir, M. J. Bergmann, H. O. Everitt, A. K. Sharmar, C. Jin, and J. Narayan Appl. Phys. Lett. 76, 979 (2000); A. K. Sharma, C. Jin, A. Kvit, J. Narayan, J. F. Muth, and O. W. Holland, Abstracts of MRS Spring 2000 Meeting, J3.19, 179 (2000)]. Such wide ranges of sensing spectra are expected to enable $Mg_xZn_{1-x}O$ UV detectors to be used in many applications such as solar UV radiation monitoring, ultra-high temperature flame detection and airborne missile warning systems. [P. Schreiber, T. Dang, G. Smith, T. Pickenpaugh, P. Gehred, and C. Litton, Proc. SPIE 3629, 230 (1999)]. Nevertheless, UV detectors based on $Mg_xZn_{1-x}O$ have not yet been reported in the prior art. The present invention enables the epitaxial growth of high quality $Mg_xZn_{1-x}O$ films on substrates such as c-plane sapphire by pulsed laser deposition, as well as the fabrication and characterization of photoconductive $Mg_xZn_{1-x}O$ UV detectors with MSM structure.

The pulsed laser deposition system and $Mg_xZn_{1-x}O$ growth process are described with particularity hereinbelow. [See also R. D. Vispute, V. Talyansky, Z. Trajanovic, S. Choopun, M. Downes, R. P. Sharma, T. Venkatesan, M. C. Woods, R. T. Lareau, K. A. Jones, and A. A. Iliadis, Appl. Phys. Left. 70, 2735 (1997)]. In brief, KrF excimer laser pulses (248 nm, 10 Hz, ~1.7J/cm²) are focused on a $Mg_{0.20}Zn_{0.80}O$ target which was mounted in a high vacuum chamber with a base pressure of ~1×10⁻⁸ torr. The substrate temperature (750° C.), oxygen pressure (1×10⁻⁴ torr) and growth rate (~0.3 Å/pulse) were previously optimized. [R. D. Vispute, V. Talyansky, S. Choopun, R. P. Shanna, T. Venkatesan, M. He, X. Tang, J. B. Halpern, M. G. Spencer, Y. X. Li, L. G. Salanmace-Riba, A. A. Iliadis, and K. A. Jones, Appl. Phys. Left. 73, 348 (1998)]. The film thickness ranged from about 0.1 to about 1 micron. The Mg composition in the film was measured by energy dispersive spectroscopy, and was found to be $Mg_{0.34}Zn_{0.66}O$. The difference between the Mg percentage in the target and in the film was attributed to the high vapor pressure of Zn and the different sticking coefficients of Zn and Mg. Without any intentional doping, the film was n-type with a resistivity of ~5×10⁷ Ω-cm, which were measured by the Seeback effect and the transmission line method, respectively. The crystalline quality of the films was examined using four-circle x-ray diffraction (XRD) and Rutherford backscattering spectrometry (RBS) employing the ion channeling technique. Optical properties were evaluated using photoluminescence and ultraviolet-visible (UV-VIS) transmission spectroscopy (Shimadzü, UV-2501 PC). To characterize the MgZnO UV detectors, a monochromator with a 150 W xenon lamp and a 1200 lines/mm grating was used. The spectral response was measured with a low noise current preamplifier (Stanford Research Systems SR571) and a lock-in amplifier (Stanford Research Systems SR530). A semiconductor parameter analyzer (Hewlett Packard 4155B) was employed for current-voltage (I-V) characterization. A calibrated power meter (Newport 1815-C, 818-UV) and a diaphragm the size of detector mesa to ensure an accurate power measurement, which is essential for obtaining a precise responsivity value were utilized. For the temporal response measurement, a nitrogen gas laser ($\lambda$=337.1 nm, $\tau \leq$4 ns) was implemented as the excitation source. The power dependence of photoresponse was measured with a continuous wave He—Cd laser (325 nm, 36 mW).

FIG. 1 shows the XRD Θ-2Θ, and Ø scans of MgZnO films grown on $Al_2O_3$(0001). The appearance of only (0001) peaks in FIG. 1(a) indicates that the film is highly c-axis oriented normal to the sapphire (0001) plane. The sharp ω-rocking curve (FWHM=0.14°) for the (0002) peak further confirms the good alignment of MgZnO(0001) lattice planes with the c-plane of sapphire. The in-plane alignment of the film as shown in FIG. 1c indicates high expitaxial quality. These results confirm that $Mg_{0.34}Zn_{0.66}O$ film is wurtzite-structured and the lattice parameter (c=5.181 Å) is close to that of ZnO (c=5.206 Å). The appearance of the MgZnO (111) peak at 2Θ=36.95°, though orders of magnitude weaker in intensity than that of MgZnO(0002), indicates the onset of phase separation and also the solubility limit of Mg in the wurtzite ZnO lattice. The surface roughness of $Mg_{0.34}Zn_{0.66}O$ films is rms~1.4 nm, as measured by atomic force microscopy. The RBS ion channeling studies (1.5 MeV He⁺) show a minimum yield ($\chi_{min}$) of ~5%. The low $\chi_{min}$ sharp XRD peaks and smooth morphology indicate good crystalline quality of the MgZnO films.

Figure 2:
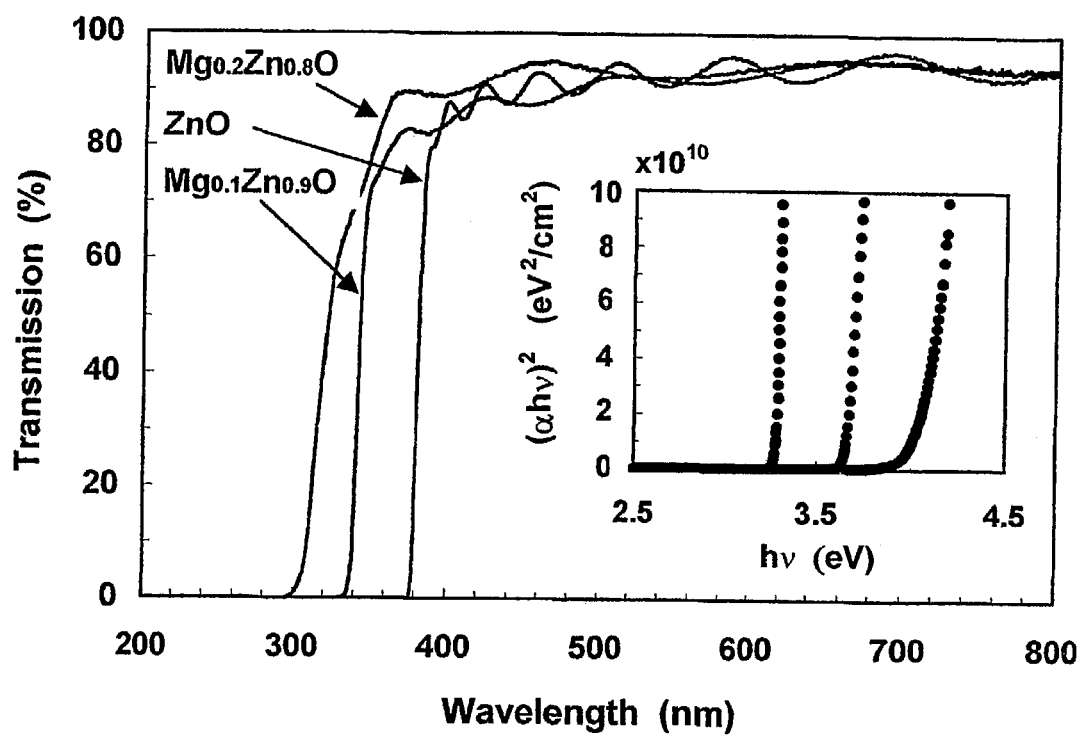
FIG. 2 depicts a UV-VIS transmission spectrum of MgZnO thin films according to the invention deposited on double-side polished sapphire.

The UV-VIS transmission spectrum of $Mg_{0.34}Zn_{0.66}O$ thin films deposited on double-side polished sapphire is shown in FIG. 2. The spectra of $Mg_{0.18}Zn_{0.82}O$ and ZnO are also presented for comparison purposes. Within the visible region, the average transmittance for all three films is over 90%. ZnO and $Mg_{0.18}Zn_{0.82}O$ exhibit sharp absorption edges at 377 nm and 340 nm, respectively, while $Mg_{0.34}Zn_{0.66}O$ at about 308 nm, which is consistent with the peak wavelength of room temperature photoluminescence. From the plot shown in the inset of FIG. 2, the band gap energy was derived. Clearly, the band gap increases with the Mg percentage from 3.3 eV for ZnO to 4.05 eV for $Mg_{0.34}Zn_{0.66}O$. The dependence of the $Mg_xZn_{1-x}O$ band gap energy as a function of Mg content in the films, which was determined by energy dispersive spectroscopy, is consistent with the results reported in the prior art.

The MgZnO thin films deposited under optimized condition were utilized for UV detector fabrication. Individual detector material was diced and bonded to the TO-9 header for further characterization. FIG. 3a shows the optical micrograph of a $Mg_{0.34}Zn_{0.66}O$ UV detector with a size of 250×1000 μm². The interdigital metal electrodes, which were defined on ~1500 Å Cr/Au bilayer by conventional photolithography and ion milling, are 250 μm long, 5 μm wide and have a pitch of 5 μm. Gold is used due to its excellent conductivity and low tendency to oxidize when deposited on oxide. However, the as-deposited Au—$Mg_{0.34}Zn_{0.66}O$ contacts are Schottky type with a small potential barrier. To ensure good ohmic contact, a thin layer (~30 Å) of chromium was used as adhesive followed by a rapid thermal annealing (350° C., 1 min) process. The Cr diffuses into the $Mg_{0.34}Zn_{0.66}O$ and eliminates the contact barrier. After these treatments, linear I-V curves were obtained as shown in FIG. 3b. Under 5V bias, the measured average dark current is ~40 nA, which is close to the calculated dark current based on the resistivity of $Mg_{0.34}Zn_{0.66}O$, indicating that the low dark current is the direct result of the high resistivity of $Mg_{0.34}Zn_{0.66}O$. The low dark current ($I_{dk}$) is helpful to enhance the detector's signal to noise (S/N) ratio since the shot noise, which exceeds the Johnson and 1/f noise if the operating frequency is not too low, is proportional to $I_{dk}$:

$$<i_s^2>=2q\cdot[1+2(G-1)^2](I_{ph}+I_{dk})\cdot B \qquad (1)$$

where q is the electron charge, G is the internal gain, $I_{ph}$ is the photocurrent, B is the bandwidth.

Upon UV illumination (308 nm 0.1 μW), the photocurrent jumped to 124 μA at 5V bias, indicating a responsivity of ~1200 A/W. This responsivity value is comparable to that of ZnO (400 A/W at 5V bias, 2–16 μm interelectrode spacing) and GaN (2000A/W at 5V bias, 10 μm interelectrode spacing) photoconductive detectors. [See, Fabricus, supra; Ohtomo, supra, and M. AsifKhan, J. N. Kuznia, D. T. Olson, J.M. Van Hove, M. Blasingame, and L. F. Reitz, Appl. Phys. Left. 60, 2917 (1992).

Figure 4:
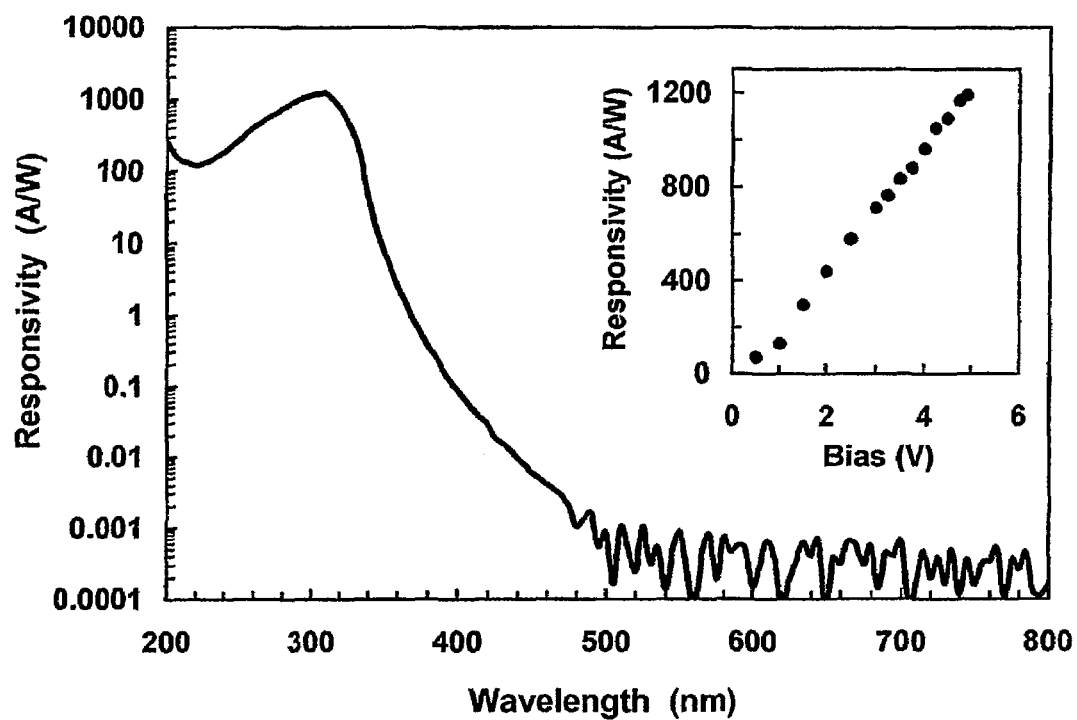
FIG. 4 depicts the spectral response of a MgZnO UV detector of the invention under front illumination

The spectral response of a $Mg_{0.34}Zn_{0.66}O$ UV detector under front illumination is plotted in FIG. 4. The peak response is found at 308 nm, which is in agreement with the absorption edge shown in FIG. 2. The ~3 dB cutoff wavelength is 317 nm, and the visible rejection (R308 nm/R400 nm) is more than four orders of magnitude, indicating a high degree of visible blindness. For wavelengths beyond the cutoff, the responsivity drops at a rate of −1.4 dB/nm, followed by a slower decrease, which may be caused by the $Mg_{0.34}Zn_{0.66}O$ alloy fluctuation. For wavelengths shorter than 308 nm, the responsivity drops initially followed by an increase at 210 nm. The drop of the responsivity in this region is attributed to the surface recombination that may be caused by ion milling. The inset of FIG. 4 shows the responsivity as a function of bias voltage with 308 nm, 0.1 μW UV illumination. A linear relationship was obtained between 0.5V and 5V, indicating no carrier mobility saturation or sweep-out effect up to the applied bias.

Figure 5:
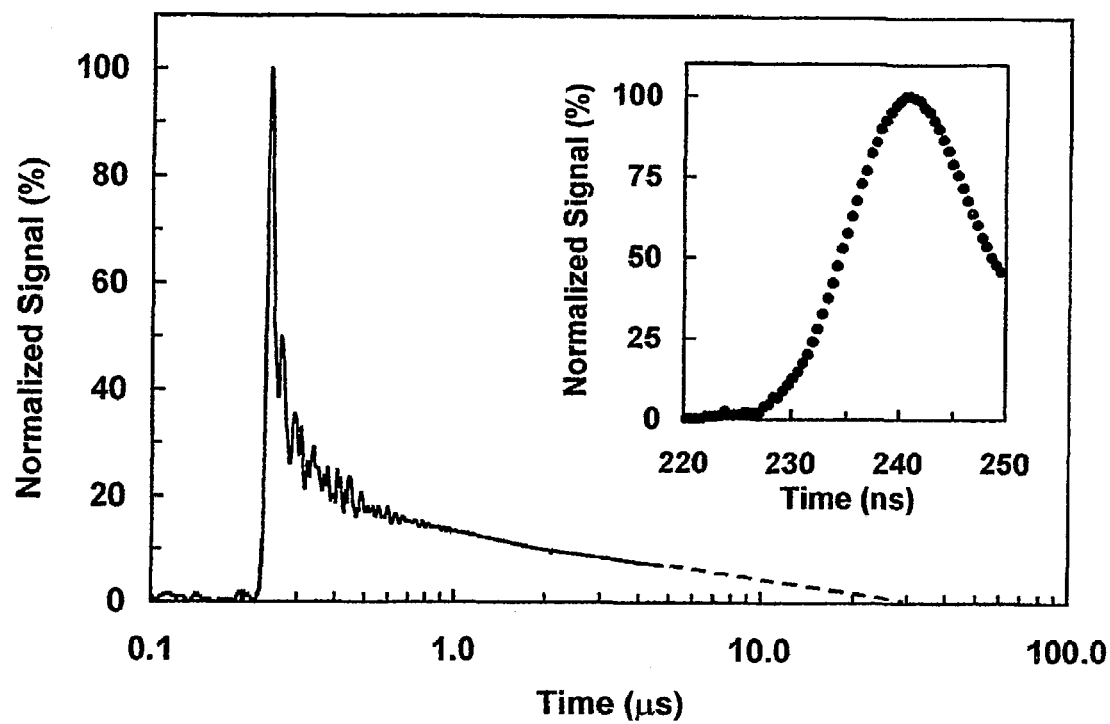
FIG. 5 depicts the temporal response of a MgZnO UV detector according to the invention.

FIG. 5 shows the temporal response of a $Mg_{0.34}Zn_{0.66}O$ UV detector with 3V bias and 50 Ω load. The 10%–90% rise and fall time are 8 ns and ~1.4 μs, respectively. The signal drops to zero at about ~30 µs as projected by the dashed line. No persistent photoconductivity was observed. The 8 ns rise time is limited by the excitation laser, which has a nominal pulse duration FWHM~4 ns. In order to understand the cause of the much longer fall time, it is necessary to consider various physical effects. We fit the decreasing portion of the temporal response with an exponential decay curve and found a fast decay component with a characteristic time $\tau_1$=4.1 ns and a slow decay component with $\tau_2$=3.9 µs. The RC constant may be responsible for the slow decay component. However, the detector capacitance was estimated to be ~1 pF and was confirmed by the actual capacitance-voltage (C-V) measurement. Even with the inclusion of parasitic capacitance and resistance from the wiring and contacts, the RC product still gives a much shorter time constant than the observed decay. Thus the RC limit is ruled out. The transit time limit can also be ruled out: At a bias of $V_b$=3V, the transit time $T_{tr}=s^2/(\mu_n \cdot V_b)$ is on the order of ~1 ns, where s is the interelectrode spacing and $\mu_n$ is the electron mobility (estimated to be 50~100 cm$^2$/Vs)[S. Choopun, R. D. Vispute, W. Noch, A. Balsamo, R. P. Shanna, T. Venkatesan, A. A. Iliadis, and D. C. Look, Appl. Phys. Lett. 75, 3947 (1999)]. The $T_{tr}$ may contribute to the 8 ns rise time but has a negligible effect on the fall time. Another factor that affected the temporal response is the excess lifetime of trapped carriers, especially the trapped holes in n-type semiconductors. If this is the case, one can expect a large internal gain and a high current responsivity.

The latter can be expressed [M. Razeghi and A. Rogalski, J. Appl. Phys. 79, 7433 (1996)] as:

$$R=q\lambda/hc[\eta_{in}(1-r)]\tau_p \cdot (\mu_n+\mu_p)V_b/s^2 \quad (2)$$

where q is the electron charge, $\lambda$ is the light wavelength, h is the Plank constant, $\eta_{in}$ is the internal quantum efficiency with a value close to unity, $\mu_n$ and $\mu_p$, are electron and hole mobility, respectively, and r is the reflectivity which can be derived from the refractive index of $Mg_xZn_{1-x}O$ reported by Teng et al, supra. Assuming the mean lifetime of holes ($\tau_p$) is on the same order of magnitude as the 10%–90% fall time, the responsivity was estimated to be R~10$^3$ A/W, which is consistent with the measured responsivity shown in FIG. 3 and FIG. 4. Further evidence comes from the distribution of hole lifetime. Assuming the trapped holes have a mean lifetime of $\tau_p$~1.4 µs, the plot of hole lifetime distribution $P(t)=1/\tau_p \exp(-t/\tau_p)$ fits well with the temporal response decay curve. It is believed that the origin of trap states may relate to the surface damage during the device processing, or the interface states associated with the wurtzite-cubic phase separation and alloy fluctuation. It is worthwhile to note that the product of gain and bandwidth $G \cdot B=(\mu_n+\mu_p) \cdot V_b/2\pi s^2$ is a constant on the order of ~10$^9$ Hz. Trading off between the gain and the bandwidth, the $Mg_{0.34}Zn_{0.66}O$ UV detectors are useful for many practical applications that need relative high gain and moderate bandwidth.

Thus, according to the present invention, there are provided visible blind UV detectors based on $Mg_xZn_{1-x}O$ thin films having a high responsivity of 1200 A/W, a fast response of 8 ns rise time, and 1.4 µs fall time. The detector shows peak responsivity at 308 nm and ~3 dB cutoff at 317 nm. Visible rejection is more than four orders of magnitude.

Preferably, $Mg_xZn_{1-x}O$ thin films wherein x has a value between about 0 and about 1 are suitable for the practice of the invention. Most preferably the UV thin film detector material comprises $Mg_{0.34}Zn_{0.66}O$. Thin films of $Mg_xZn_{1-x}O$ are suitably deposited, preferably epitaxially by the pulsed laser ablation deposition (PLAD) techniques described hereinbelow, on suitable substrates such as $Al_2O_3$, MgO, ZnO, buffered silicon, SiC, GaN, GaN/$Al_2O_3$, and the like to a thickness of from about 0.1 to about 1 micron.

Figure 6:
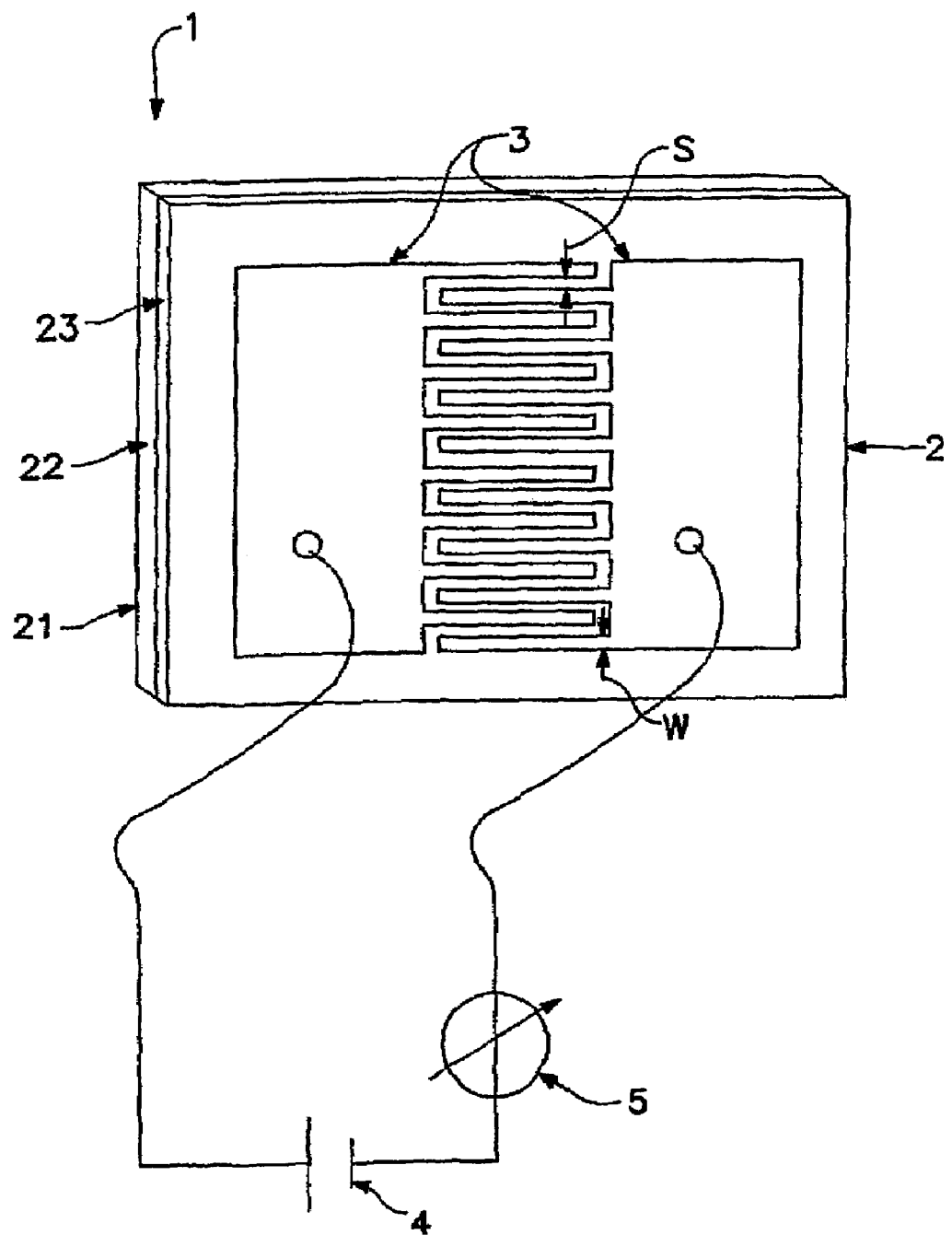
FIG. 6 depicts a photodetector circuit according to one embodiment of the invention.

One embodiment of a photodetector 1, according to the present invention is depicted in FIG. 6. Photodetector 1 includes a device 2 having interdigitated electrodes 3 formed thereon connected to external circuitry. The external circuitry comprises a biasing source 4, and a measurement instrument, such as a current meter 5. Biasing source 4 may be any suitable voltage source. In a preferred embodiment the source is a battery operating within the range of 5–25 volts. Current meter 5 may be any suitably sensitive current meter. In one embodiment a Kiethley Model 614 is used.

In operation, photons (in the form of incident light) strike the surface of device 2. Photons of suitable wavelength are absorbed and give rise to electron hole pairs (one for every photon absorbed) within device 2. The electrical conductivity of device 2 increases in proportion to the photon flux (number of photons per second). An external electric field, generated by application of the bias voltage from source 4, causes the electrons and holes to be transported within the device, thereby giving rise to a current in the external circuitry which is measurable by current meter 5. It will be understood by those skilled in the art, however, that a device embodying the detector of the invention will operate without an applied voltage inasmuch as an electrical signal output is generated by the electron hole pairs created by the absorbed photons.

Device 2 consists of a thin film of $Mg_xZn_{1-x}O$ formed on a substrate. Depending on the material used for the substrate, a buffer layer may be used between the substrate and the thin film. That is, where the lattice mismatch, as defined by the lattice constants and the crystal structure of the substrate and the single crystal layer is large, a buffer layer may be used in order to form the single crystal layer on the substrate with reduced defect density. Where the thermal coefficients of the respective materials are mismatched, a buffer material may also be required. Where the lattice constant and the crystal structure of the substrate and sin crystal layer are about the same or the thermal coefficients are about the same, a is not necessary.

According to one embodiment, device 2 comprises three layers including a base substrate 21, a buffer layer 22 and a film 23. Base substrate 21 is, e.g., silicon. Buffer layer 22 is deposited thereon. Thin film 23 is deposited on buffer layer 22. Thereafter, the surface of device 2 may be coated with an antireflective coating (not shown).

Following is a description of the epitaxial growth of cubic-$Mg_xZn_{1-x}O$ thin films on Si(100) using a pulsed laser deposition technique. To overcome the large lattice and thermal mismatch between $Mg_xZn_{1-x}O$ and Si(100), various materials were tested as buffer layers. The epitaxial growth of cubic-$Mg_xZn_{1-x}O$ on Si(100) was realized with double buffer layers of $SrTiO_3$/SrO, $SrTiO_3$/TiN or $BiTiO_{12}$/Y-stablized-$ZrO_2$. The epitaxial relationship found to be $Mg_xZn_{1-x}O(100)$// buffer(100)//Si(100), $Mg_xZn_{1-x}O$[100 ]// Si[100] for all buffers except for $SrTiO_3$/SrO, which has a 45° in-plane lattice rotation with respect to Si. The good crystalline quality of the $Mg_xZn_{1-x}O$ epilayers was confirmed by the narrow x-ray diffraction lines, low Rutherford backscattering ion channeling yield and smooth surface morphology observed with atomic force microscope. The Mg and Zn composition in the $Mg_xZn_{1-x}O$ epilayer was measured using energy dispersive spectroscopy. The band gap energies of $Mg_xZn_{1-x}O$ films was derived from the ultraviolet-visible transmission spectra and were found to increase monotacally with the deposition temperature. The relationship of $Mg_xZn_{1-x}O$ band gap energy, Zn/Mg composition and the deposition temperature is also discussed herein below.

ZnO and $Mg_xZn_{1-x}O$ have been subjects of intense scientific research as wide band gap optoelectronic (OE) materials, due to the ever-increasing demands for blue and ultraviolet (UV) photon emitters and detectors in many technical areas. Particularly, the large exciton binding energy of ZnO (60 meV) enables high exciton population and potentially low lasing threshold when used in current injection lasers. The availability of lattice matched single-crystal substrates (ZnO, MgO etc.), the tunable band gap of $Mg_xZn_{1-x}O$ (3.3eV to 7.98eV, depending on Mg fraction) and the relatively low thin film growth temperatures (100–750° C.) ease the device fabrication process. The high chemical inertness hardness enables the ZnO and $Mg_xZn_{1-x}O$ based devices to be used in harsh environment. In recent years, room temperature stimulated photon emission have been observed by several investigators. Previous studies have shown that ZnO and $Mg_xZn_{1-x}O$ with low Mg fraction have wurtzite structure, while higher Mg compositions lead to cubic $Mg_xZn_{1-x}O$ (c-MgZnO) with lattice constants close to that of MgO. The c-MgZnO has a band gap range that covers the solar-blind window (about 240–280 nm), thus rendering it ideal for applications such as atmosphere ozone monitoring and missile warning systems.

To date, most ZnO and $Mg_xZn_{1-x}O$ based OE devices are grown on sapphire and used as discrete units. The integration of ZnO and $Mg_xZn_{1-x}O$-based OE devices with Si-based electronic supporting circuits on a single chip is of great importance for practical applications such as vertical cavity surface emitting laser (VCSEL) array, UV camera and optical computation. Since Si-based VLSI techniques are well established and their reliability and economy have been acknowledged for decades, it is technically important and commercially beneficial to epitaxially grow ZnO and $Mg_xZn_{1-x}O$ on Si, which is the bridge toward Si-based optoelectronic integrated circuits (OEIC). However, the epitaxial growth of c-MgZnO on Si(100) is also a challenge because of the large lattice mismatch (−22.4%) between cMgZnO and Si(100). The thermal mismatch can also not be neglected. Moreover, the easy oxidation of Si surfaces to yield amorphous $SiO_2$ layers that prevent any epitaxial growth, especially since Si can take oxygen from either the ambient gas inside the growth chamber or react with the deposited oxide film at elevated temperature, renders the growth of such films even more problematic. Thus, an appropriate buffer layer must be used and the right growth process must be followed to obtain high crystalline quality c-MgZnO epilayers.

EXAMPLES

The c-MgZnO films described below as well as the various buffer layers were grown using PLD technique. In brief, the KrF excimer laser pulses ($\lambda$=248 nm, $\tau$=30 ns) were focused on a selected PLD target mounted on a multi-target carousel inside a high vacuum chamber with a base pressure of $\sim 1\times 10^{-8}$ torr. The ablated target materials were deposited on heated substrates located ~7 cm away. The laser energy fluence was set between 1.5 J/cm$^2$ to 2.5 J/cm$^2$, which was previously optimized. Laser pulse repetition rates were varied between 1 to 10 Hz. The substrate temperatures and the oxygen pressures inside the chamber were adjusted from room temperature to 900° C. and from vacuum to $1\times 10^{-2}$ torr, respectively.

TABLE 1

Crystal Structures, lattice constants, thermal expansion coefficients of c-MgZnO, Si and various buffer materials The value of buffer-to-Si and buffer-to-c-MgZnO lattice mismatch is calculated The PLD conditions used in the examples are also given in the table.

| Materials | Crystal structure | Lattice (Å) | Thermal expansion coefficient- $\times 10^{-6}$/° C. | Lattice mismatch to Si (%) | Lattice mismatch to cMgZnO (%) | PLD conditions |
|---|---|---|---|---|---|---|
| c-MgZnO | cubic | 4.22 | ~9 | −22.42 | — | 30–850'° C. $10^{-7}$–$10^{-2}$ torr $O_2$ |
| SrTiO$_3$* (STO) | cubic | 3.905 | 9 | +1.6 | −7.8 | 600–800° C. $10^{-4}$–$10^{-2}$ torr $O_2$ |
| SrO | cubic | — | — | — | — | 800° C. vacuum |
| TiN | cubic | 4.242 | 9 | −21.89 | — | 800–900° C. vacuum |
| Bi$_4$Ti$_3$O$_{12}$ (BTO) | Ortho-rhombic | a = 5.41 b = 5.49 c = 32.8 | 11 | −0.38 | — | 600–800° C. lci'– $10^{-1}$–$10^{-4}$ torr $O_2$ |
| ZrO$_2$ with 10% Y (YSZ) | cubic | 5.139 | 10 | −5.37 | −18 | 700–800° C. $10^{-5}$ torr $O_2$ |
| CeO$_2$ | cubic | 5.411 | 11 | −0.36 | — | 700–800° C. $10^{-4}$ torr $O_2$ |
| Si | diamond | a = 5.431 | 4 | — | — | — |

*after a 45U in-plane lattice rotation

Table 1 lists the crystal structures, lattice constants and thermal expansion coefficients of c-MgZnO, Si and various buffer materials used in the examples. The lattice mismatches of buffer layers to Si and c-MgZnO were calculated. The PLD growth parameters for each material are given in the table. All PLD targets arc commercially available except the $Mg_xZn_{1-x}O$ target, which was made by mixing 20% to 50%/mol of MgO power (4N purity) with ZnO powder (4.5N purity) followed by a hydraulic press (300 Mpa/cm$^2$) and 3 MW microwave sintering (1300° C., 2 hr). The target density was over 90% of theoretical.

Except for depositing YSZ, the Si(100) wafer was cleaned by conventional HF containing solution to remove oxide before loading into the PLD chamber. The H-terminated Si was degassed at 200° C. in vacuum and raised to 850° C. to desorb residual $SiO_x$. In the case of deposited YSZ, native silicon oxide was kept on the Si wafer. The thicknesses of the c-MgZnO films are 2000–5000 Å, while the buffer layers were kept below 500 Å. The crystalline quality of the films was examined using four-circle x-ray diffraction. (XRD), and Rutherford backscattering spectrometry (RBS) with ion channeling technique (1.5 Mev$^4$He$^+$). Surface morphology of the films was observed using atomic force microscope (AFM, Digital Instruments Inc) and scanning electronic microscope (SEM, FEI F1B620). The exact Mg and Zn compositions in the c-MgZnO epilayers were measured using energy dispersive x-ray spectrometer (EDS, JEOL 8900). The depth profile of each element in the films was sensed by secondary ion mass spectroscopy (SIMS). Ultraviolet-visible (UV-VIS) transmission spectroscopy (Shimadzu, UV-2501 PC) was employed to characterize the optical properties of the c-MgZnO films.

Example 1

FIG. 1 is an XRD Θ-2Θ scan of (a) c-MgZnO/Si(100), (b)c-MgZnO/STO/SrO/Si (100), (c) c-MgZnO/STO/TiN/Si (100) (d) c-MgZnO/BTO/YSZ/Si(100). The c-MgZnO films were grown at 600° C. with oxygen partial pressure of $1\times10^{-6}$ torr. The film thickness is 2000–5000 Å. The plot is in semi-logarithm scale. FIG. 1 is the XRD Θ-2Θplot of c-MgZnO films grown on Si(100) with various buffer layers. The result of c-MgZnO films grown directly on Si(100) without any buffer is also provided as a reference. As can be seen from FIG. 1(a) that without a buffer layer, only a broad MgZnO(111) peak appears at 2Θ=36.8° (FIG. 1-a). The intensity of this peak is more than four orders of magnitudes lower than that of Si(400), indicating that the film is essentially amorphous. Due to the large lattice mismatch, the epitaxial growth of c-MgZnO on Si(100) can only be obtained when proper buffers are applied. FIGS. 1(b)(c)(d) show that the crystalline quality of the c-MgZnO films was improved significantly when a buffer was inserted. The high intensity sharp MgZnO (200) peak at 2Θ=42.9° indicates that the c-MgZnO is c-axis oriented. The lattice constant of c-MgZnO is calculated as a=4.22 Å, which is very close to that of MgO (a=4.22 Å). Note that the buffer layers STO, BTO, TiN and YSZ are also highly c-axis oriented as indicated by the presence only of (001) family peaks, implying that the cubic-on-cubic epitaxial growth has been realized.

Example 2

FIG. 2 is an XRD Φ scan of c-MgZnO/STO/SrO/Si (b) c-MgZnO/BTO/YSZ/Si. The in-plane alignment of c-MgZnO, buffer layer and Si is indicated by the position of diffraction peaks. The epitaxial growth of c-MgZnO on Si (100) is further confirmed by the XRD-scan Φ shown in FIG. 2. For c-MgZnO grown on all three sets of buffer layers, i.e. STO/SrO, STO/TiN, BTO/YSZ, the Φ scans show 4-fold azimuth symmetry, indicating the cubic crystal structure of c-MgZnO. The average full width at half maximum (FWHM) of c-MgZnO is 0.5° for c-MgZnO with STO/SrO buffer, 0.7° for c-MgZnO with BTO/YSZ buffer, compared with the 0.4° of Si(100). The line width of c-MgZnO grown on STO/TiN/Si(100) is slightly larger (~1°) due to the poor interface between TiN and Si.

Except for STO/SrO, the maximum Φ-scan diffraction of c-MgZnO is at the same angle as that of buffer layer and Si substrate, indicating the in-plane alignment is c-MgZnO [100]//buffer [100]//Si[100]. For STO/SrO buffer, however, the four STO(111) peaks are 45° away from that of Si(111) peaks, implying a 45° in-plane rotation of STO unit cell with respect to Si. This lattice rotation of STO significantly reduces the lattice mismatch from the −28.2% without rotation to +1.6% with 45° rotation. It is interesting to note that even though the lattice mismatch is as large as 22.9%, no lattice rotation was observed between TiN and Si. SIMS and TEM results (not shown) indicate that TiN has diffused into Si at elevated temperature thus partly releasing the tension. SEM pictures also show the cracking of TiN films along [100] and [100] directions.

Combining the results depicted in FIGS. 1 and 2, the epitaxial relationship can be described as c-MgZnO(100)//buffer(100)//Si(100) for all three sets of buffer layers, and MgZnO[100]//buffer [100]//Si[100] for STO/TiN and BTO/YSZ, respectively. The STO/SrO buffer rotates 45° from that of the Si lattice with in-plane alignment of c-MgZnO [100]//STO [100]//Si[110].

Example 3

Figure 3:
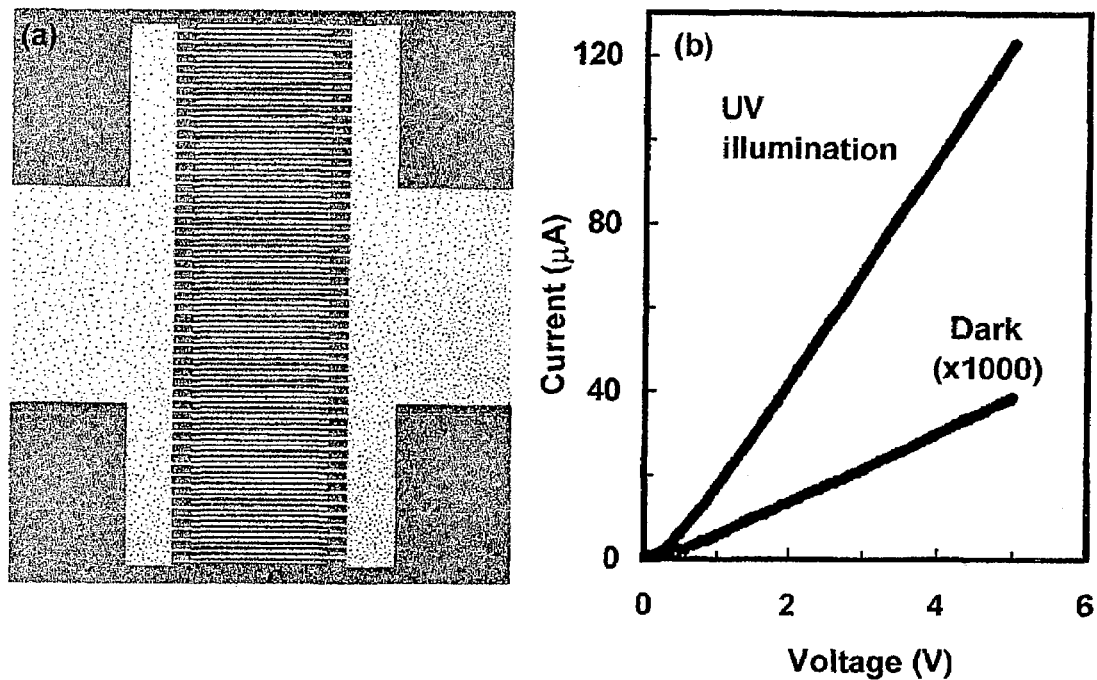
FIG. 3(a) depicts an optical micrograph of a MgZnO UV detector according to the invention.
FIG. 3(b) depicts linear I-V curves of the detector of FIG. 3(a).

FIG. 3 depicts full width at half maximum (FWHM) of c-MgZnO(200) rocking as curves functions of (a) PLD deposition temperature and (b) oxygen pressure. The c-MgZnO films are grown on STO/SrO/Si(100) (*), BTO/YSZ/Si(100) (**) and STO/TiN/Si(100) ( ). To find the optimal PLD growth conditions, the XRD line widths of c-MgZnO grown at different conditions were measured, which serve as an indicator of c-MgZnO crystalline quality. Shown in FIG. 3 is the FWHM of ω-rocking curves of c-MgZnO as functions of substrate temperature and oxygen partial pressure. As shown in FIG. 3(a), for substrate temperatures from 30° C., to 600° C., the FWHM of ω-rocking curves decrease sharply from 2.5° to 0.23°, indicating the significant improvement of crystalline quality. Above 600° C., the narrowing of a XRD line width is not significant. At 800° C., a broadening of XRD rocking curve to 0.28° was observed, which may be caused by the change of chamber base pressure due to the degassing of the substrate heater. Thus 400° C. to 600° C. is the proper window of PLD growth.

The c-MgZnO crystalline film can be also improved by lowering the oxygen partial pressure during the deposition. FIG. 3(b) shows that at fixed substrate temperature of 600° C., the rocking curve line width drops from 0.64° at an oxygen pressure of $1\times10^{-3}$ torr to 0.23° if the oxygen pressure drops to $1\times10^{-6}$ torr. The results indicate that lower oxygen partial pressures are beneficial to c-MgZnO growth.

However, as in other PLD processes, the oxygen partial pressure also affects the c-MgZnO film deposition rate. With $10^{-2}$ torr of oxygen inside the chamber, the deposition rate was around 0.5 Å/pulse. This number drops to 0.3 Å/pulse for oxygen pressure equal to $10^{-4}$ torr, and further drops to 0.2 Å/pulse when the oxygen partial pressure is $10^{-6}$ torr. Trading off between crystalline quality and deposition rate, the optimal $O_2$ pressure regime was found to be around $10^{-5}$–$10^{-6}$ torr.

Other PLD parameters such as laser energy fluence and pulse repetition rate may also affect c-MgZnO film quality. Within the optimized laser energy fluence (1.5~2.5 J/cm$^2$), the variation of XRD line width is negligible. Beyond 3 J/cm$^2$ particles were observed on the c-MgZnO films and thus should be avoided. Up to 10 Hz, the effect of laser pulse repetition rate to the c-MgZnO film crystalline quality is not obvious. However, low pulse repetition rate gives low deposition rate and, hence, is not practicable.

Example 4

FIG. 4 depicts RBS random and channeling spectra of c-MgZnO grown on $SrTiO_3$ buffered Si(100) at temperature (a) 600° C. and (b) 800° C. The c-MgZnO films were further characterized using RBS with 1.5 MeV $He^+$ ions. The minimum ion channeling yield $\chi_{min}$ which serves as another indicator of the film's crystalline quality, was found to also depend on the growth temperature. Shown in FIG. 4 are the RBS random and aligned backscattering spectra of c-MgZnO grown at 600° C. and 800° C., respectively. For the films grown at 600° C., the minimum ion channeling yield is $\chi_{min}$=5% for Zn at the surface. The $\chi_{min}$ for Sr at interface is 12% due to the 8% lattice mismatch between the c-MgZnO top layer and the STO buffer. This value goes up to 20% if the c-MgZnO films are grown at 800° C., which is in accordance with the broadening of the XRD line width shown in FIG. 4. The shape and position of the RBS peaks corresponding to Sr and Zn reveal the reason for the film crystalline degradation with the increase of temperature. In FIG. 4(a), clear Sr and Zn peaks can be resolved, indicating the sharp MgZnO/$SrTiO_3$ interface. In FIG. 4(b), however, no distinct Sr and Zn peaks can be found, even though the Sr, which is part of the STO buffer layer, was below the c-MgZnO top layer. The merging of Sr and Zn spectra indicate that Sr has diffused into c-MgZnO film at this temperature. Thus rough interface and higher $\chi_{min}$ is expected.

On the low temperature side, though no buffer layer element diffusion was observed, the $\chi_{min}$ also quickly goes up until there is no obvious ion channeling at Ts <200° C., indicating the degradation of c-MgZnO crystalline quality.

Example 5

FIG. 5 sets forth an atomic force microscope picture of c-MgZnO grown on $SrTiO_3$ buffered Si(100) at temperatures of (a) 600° C. and (b) 800° C. The morphology of c-MgZnO thin films was evaluated using atomic force microscopy. FIGS. 5(a) and (b) are the AFM images of c-MgZnO grown on $SrTiO_3$ buffered Si at 600° C. and 800° C., respectively. The films grown at 600° C. have a very smooth surface with root mean square (RMS) surface roughness of only 3.57 Å. No obvious grains were observed. With the increase of substrate temperature, the films turn rougher, as indicated by the 21.29 Å surface RMS for the film deposited at 800° C. A similar trend of surface roughness varying with the deposition temperature was found for the c-MgZnO films grown on two other sets of buffered layers, i.e. BTO/YSZ or STO/TiN. The coincidence of minimum XRD line width shown in FIG. 3, lowest RBS ion channeling in FIG. 4 and the smooth morphology shown in FIG. 5(a) for the films grown at 600° C. indicate this temperature is within the optimal growth window for c-MgZnO.

Example 6

FIG. 6 shows UV-VIS transmission spectra of c-MgZnO grown MgO(100) at (a) room temperature (b) 200° C. (c) 400° C. (d) 600° C. and (e) 800° C. The results of ZnO (f) and MgO (g) deposited on c-plane sapphire substrates were also given for references. The inset is the plot of $(\alpha h\nu)^2$ versus $h\nu$-that gives the estimated band gap energy of c-MgZnO deposited at different temperatures. To investigate the optical properties of c-MgZnO films, the c-MgZnO was deposited on MgO(100) substrates. Shown in FIG. 6 are the UV-VIS transmission spectra of c-MgZnO films deposited on double side polished MgO(100) substrates at different substrate temperatures. The spectra of MgO and ZnO grown on c-plane sapphire substrates are also provided as references. Within the visible region, the average transmittance of c-MgZnO films is over 90%, indicating that c-MgZnO is highly transparent to visible light. Interference caused oscillation indicates that the films are flat. From the oscillation period, the film thickness was estimated to be 2000–3500 Å, which is in agreement with the film thickness measured with RBS and stylus.

It is worthwhile to note that the position of the exciton absorption edge shifts significantly to the low wavelength side with the increase of substrate temperature, implying the expansion of c-MgZnO's band gap energy. This band gap shift is more clear with the plot of $(\alpha h\nu)^2$ versus $h\nu$ shown as the inset of FIG. 6, which gives the band gap energy at the intersection with the horizontal axis. When grown at RT, the c-MgZnO film show an absorption edge at 280 nm, corresponding to a band gap energy of 4.6 eV. The band gap increases nearly linearly with the growth temperature. At 800° C., the absorption edge shifts to below 200 nm. The band gap of this film was estimated to be about 6.8 eV.

It is also worthwhile to note that the slope of the absorption edge, which indicates the crystalline quality of the c-MgZnO films, changes with the deposition temperature. The films deposited at high temperatures exhibit sharp absorption edges, while film deposited at room temperature has much flatter absorption edge. The change of absorption edge slope with temperature is consistent with the decrease of XRD line width shown in FIG. 3.

Example 7

FIG. 7 shows the energy dispersive spectroscopy of c-MgZnO films deposited at 600° C. The inset shows the variation of Mg composition in the films as a function of substrate temperature. The bandgap of c-MgZnO depends on the Mg and Zn composition in the c-MgZnO films. Hence knowing the composition of the Mg and Zn in the films is the key to understanding the blue shift of the absorption edge shown in FIG. 7. FIG. 7 is the energy dispersive spectroscopy of c-MgZnO films deposited at $T_s$=600° C. on STO/SrO/Si(100). The Zn is marked by the $K\alpha$ and $L\alpha$ peak at 8.638 keV and 1.009 keV, respectively. A small $K\alpha$ peak at an energy of about 9 keV is also visible. The Mg is labeled by the $K\alpha$ peak at 1.254 keV. Within the detection limit of EDS (~0.5 wt %), no detectable impurities were found. The Mg and Zn compositions were calculated and were found to be $Mg_{0.78}Zn_{0.21}O$ for this film. Shown in the inset is the variation of Mg composition in the films as a function of substrate temperature. The curve is the polynomial fitting of the data point in a least squares sense. As can be seen from the plot the Mg composition increases almost linearly with temperatures up to 600° C. The reason for this increase is discussed herein below.

(a) The selection of buffer materials—To select a proper buffer layer, there are three major concerns; (1) lattice. Thermal match to c-MgZnO if the c-MgZnO grows thereon; (2) lattice/thermal match to Si (100) if it grows thereon, and (3) capability of quenching the formation of $SiO_x$ if it grows on Si(100). The first two conditions require the buffer layer to have a cubic crystal structure and a proper lattice/thermal expansion constant that can bridge the large lattice mismatch between Si and c-MgZnO. Satisfying the third requirement is essential for the epitaxial growth of any thin films on Si.

SrTiO$_3$ has a cubic perovskite structure and is well recognized as a high dielectric constant (~300) material for non-volatile memories and a buffer layer for high-T$_c$ superconductors. Its lattice mismatch to Si (100) and c-MgZnO is +1.6% (after a 45° lattice rotation) and −9% respectively. The thermal mismatch is however, tolerable. Testing results (not shown) of growing c-Mg$_x$Zn$_{1-x}$O on single crystal SrTiO$_3$ (100) indicates a high quality epitaxial film, thus rendering SrTiO$_3$ one of the best choice for buffering c-Mg$_x$Zn$_{1-x}$O on Si.

Nevertheless, when directly grown on Si(100), SrTiO$_3$ films usually show a mixture of (100) and (110) planes due to the presence of SiO$_x$. Since the oxidation of Si surface is inevitable in the oxide growth process, it is necessary to find a second buffer between Si and SrTiO$_3$ that has a larger binding energy with oxygen than the Si—O bond. Accordingly, SrO and TiN can be used to improve the SrTiO$_3$/Si interfaces. Formation enthalpy for SrO and Si$_3$N$_4$ are −592 kJ/mol and −743.5 kJ/mol, respectively, both being compatible in magnitude with that of SiO$_2$'s −910.7 kJ/mol value. Consequently the SrO and TiN quench, to a certain degree, the formation of amorphous SiO$_x$. The SrTiO$_3$ films grown on SrO or TiN buffered Si(100) show improved epitaxial quality.

Yttrium stabilized ZrO$_2$ (YSZ) is another widely used buffer material that grows epitaxially on Si(100) even without intentional removal of native silicon oxide from the Si substrate. The lattice mismatch between YSZ and Si is only −5.37%. The formation enthalpy of ZrO$_2$ (−100.6 kJ/mol) is larger than that of SiO. The combination of these two effects leads to high quality YSZ epilayers on Si(100) with the epitaxial relationship of YSZ(100)//Si(100) and YSZ[100]//Si[100].

However, due mainly to the large lattice mismatch between c-MgZnO and YSZ, the c-MgZnO grown on YSZ shows the MgZnO(111) plane parallel to the (100) plane of YSZ. The off-plane XRD phi-scan of c-MgZnO shows 12-fold azimuth symmetry, implying multiple in-plane orientation of c-MgZnO lattice cells with respect to that of YSZ. Thus c-MgZnO can not be epitaxially grown on YSZ/Si(100). This challenge is overcome by inserting a thin layer of BTO (<100 Å) as the second buffer between c-MgZnO and YSZ. The high affinity of c-axis growth of BTO is helpful for c-axis growth of c-MgZnO. After the adoption of BTO, c-axis originated c-MgZnO films with 4-fold azimuth symmetry was realized on Si(100).

Other buffer layers such as CeO$_2$ and B$_{14}$T$_{13}$O$_{12}$ both have less than 1% of lattice mismatch to a Si(100) substrate. CeO$_2$ is also known for epitaxial growth on Si (111). However, when grown on Si(100), neither one gives high quality epilayers, perhaps due to the oxidation of the Si surfaces.

(b) Deviation of Zn and Mg composition in the c-MgZnO films from that in the target—The energy bandgap of c-MgZnO is usually much larger than that of ZnO. To grow the c-MgZnO films, one may have surmised that a Mg rich PLD target is necessary. However, we have found that the composition of Mg in the films deviate significantly from the mole percentage of Mg in the target. Even a PLD target with a low Mg composition of 25% can be used for growing c-MgZnO films.

The unexpected higher Mg concentration in the films implies a net Zn loss. Several potential causes include: 1) The MgZnO target was sintered at 1300° C. and the Zn and Mg may evaporate, especially from the surface region, in the sintering process with different ratios that cause a net Zn loss; 2) during the PLD process, the Zn and Mg elements may have different photo absorption cross-sections and thus different ablation rates; 3) when reached at the substrate, Zn species may also have a smaller sticking coefficient than that of Mg, thereby resulting in a Mg-rich film; 4) the different vapor pressures of Zn and Mg also can not be neglected; 5) in addition, Zn and Mg species may have different optimal windows of oxygen partial pressure-at high temperature, the actual partial oxygen pressure inside the PLD chamber may differ from the vacuum gauge reading due to the degassing of the heater, which may also cause different Zn and Mg deposition rates.

To unveil the cause of Zn lose, we first measured the Zn and Mg composition in the target using energy-dispersive-x-ray spectrometer. No significant Zn loss was found from the target surface. Further measurement of Zn and Mg depth profiles revealed that Zn and Mg have uniform distributions in the target. Thus high temperature sintering was ruled out as the cause of Zn lose.

More clues come from the plot of Mg composition in the c-MgZnO films as a function of deposition temperature as shown in FIG. 7. Clearly the film deposited close to room temperature has almost the same Mg and Zn composition as in the target, implying that the ablation rates of Mg and Zn species is close if not equal. Thus, ablation rate difference should be excluded as the cause of Zn loss in the films. This result also implies that the sticking coefficient difference between Mg and Zn species is minimal, at least for a substrate at room temperature. We also measured the Mg and Zn composition at higher growth temperatures under identical growth conditions but on different substrates which include Si(100), YSZ(100), Al$_2$O$_3$(0001), SrTiO$_3$(100) and find similar Mg and Zn compositions. Consequently the suspicion of sticking coefficient caused Zn loss should be excluded.

The influence of oxygen partial pressure on the changes of Mg to Zn ratio in the c-MgZnO films was also excluded, since the measuring of Mg to Zn ratio from the films deposited at the same temperature but different oxygen pressure ($10^{-1}$ to $10^{-7}$ torr) have similar results.

After excluding other causes, the high vapor pressure of Zn spices at elevated temperature is most likely responsible for the Zn loss in the c-MgZnO films. At 400° C., the vapor pressure of Zn and Mg are $1 \times 10^{-1}$ torr and $2 \times 10^{-3}$ torr, respectively. These two values go up to $2 \times 10^2$ torr and $3 \times 10^1$ torr, respectively at 800° C. Qualitatively, such a high vapor pressure is enough to affect the Zn composition. When the vapor pressure of Zn and Mg is high enough, the Zn and Mg composition in the film is determined by the vapor pressure rather than the mol percentage of Mg and Zn in the target. Quantitative analysis further confirms the result. Assuming that the composition of Mg and Zn in the cMgZnO films is inversely proportional to the Zn and Mg's vapor pressure, the Zn and Mg ratio in the c-MgZnO film can be easily calculated as 11% and 89%, respectively, which is very close, the Mg 87%, Zn 13% shown in FIG. 7. Further evidence comes from measuring the Zn composition in the films using Mg$_x$Zn$_{1-x}$O targets with different x value. If the vapor pressure of Zn and Mg dominates the Zn and Mg composition, cMgZnO films from different targets should have the similar Zn composition at high temperature, when the vapor pressure rather than the composition of target dominates the composition of the film. We found that the difference of Zn composition in the targets was only reflected in the low temperature region, where the Zn and Mg vapor pressure is too low to have any significant effect.

At 800° C., the Zn and Mg compositions in all of the films are Mg 87%, Zn 13% respectively, even though the different targets of $Mg_{0.3}Zn_{0.7}O$, $Mg_{0.4}Zn_{0.6}O$ and $Mg_{0.6}Zn_{0.4}O$ were used. Thus the high vapor pressure of Zn and Mg, as well as the ratio of vapor pressures is most likely the cause of the deviation of Zn loss in the c-MgZnO films.

It is worthwhile to note that even at a temperature as high as 1000° C., the vapor pressure of ZnO and MgO is in the order of $10^{-5}$ torr and $10^{-6}$ torr, respectively, which should not affect the composition of Zn and Mg in the films. This result implies that in the laser plume Zn and Mg intermediate species exist as atoms and ions rather than as oxide molecules, although they exist as oxide in the target as well as in the films.

The invention claimed is:

1. A UV detector consisting essentially of a single active thin film of a photoconductor material consisting of $Mg_xZn_{1-x}O$, wherein x has a value such that said photoconductor material will generate a detectable electric current when exposed to UV light in the wavelength range of from about 150 nm to about 400 nm, and first and second spaced apart electrodes in contact with a top face of said active thin film photoconductor material.

2. A visible-blind UV detector according to claim 1.

3. A solar-blind UV detector according to claim 1.

4. A UV detector according to claim 1, wherein x has a value between about 0 and 1.

5. A UV detector according to claim 1, wherein said material comprises $Mg_{0.34}Zn_{0.66}O$.

6. A UV detector according to claim 1, including a substrate supporting a bottom face of said thin film photoconductor material.

7. A UV detector according to claim 6, wherein said thin film is epitaxially grown on said substrate.

8. A UV detector according to claim 7, wherein said thin film is epitaxially grown by PLAD.

9. A UV detector according to claim 6, including a buffer layer between said thin film and said substrate, said buffer layer comprising a material that accommodates any lattice and/or thermal mismatch between said thin film and said substrate.

10. A UV detector according to claim 9, wherein said buffer material comprises $SrTiO_3/SrO$, $SrTiO_3/TiN$ or $BiTiO_{12}$/Y-stabilized $ZrO_2$.

11. A UV detector according to claim 1, further comprising:
    a voltage source connected across said first and second electrodes,
    said voltage source creating an electric field within said thin film,
    wherein when the surface of the thin film upon which the electrodes are deposited is subjected to a photon illumination, electron hole pairs are created and flow within said thin film.

12. A method of fabricating a UV detector according to claim 11, comprising fabricating said thin film, depositing a first electrode on a surface of said thin film, depositing a second electrode on the surface of the thin film, said second electrode being spaced from said first electrode, and conecting a voltage means and a current detector to said first and second electrodes.

13. A UV detector according to claim 11, including a current detector connected to said first and second electrodes to measure the current from said thin film when exposed to UV radiation.

14. A UV detector according to claim 11, wherein said voltage source is a battery.

* * * * *

UNITED STATES PATENT AND TRADEMARK OFFICE
CERTIFICATE OF CORRECTION

| | | |
|---|---|---|
| PATENT NO. | : 7,132,668 B2 | Page 1 of 1 |
| APPLICATION NO. | : 10/311997 | |
| DATED | : November 7, 2006 | |
| INVENTOR(S) | : Ratnakar Vispute et al. | |

It is certified that error appears in the above-identified patent and that said Letters Patent is hereby corrected as shown below:

Insert after the title before the "BACKGROUND OF THE INVENTION" line 4 the following language:

--This invention was made with government support under grant number DAAD179920078 awarded by Army Research Laboratories ("ARL"). The government has certain rights in the invention.--

Signed and Sealed this

Twenty-third Day of November, 2010

David J. Kappos
*Director of the United States Patent and Trademark Office*